United States Patent
Shih et al.

(10) Patent No.: US 8,030,964 B1
(45) Date of Patent: Oct. 4, 2011

(54) TECHNIQUES FOR LEVEL SHIFTING SIGNALS

(75) Inventors: Shou-Po Shih, San Jose, CA (US); Weiqi Ding, Fremont, CA (US); Juei-Chu Tu, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 22 days.

(21) Appl. No.: 12/121,028

(22) Filed: May 15, 2008

(51) Int. Cl.
*H03K 19/0175* (2006.01)
(52) U.S. Cl. ............................. 326/81; 326/68
(58) Field of Classification Search ............... 326/80–81, 326/63, 68; 327/333
See application file for complete search history.

(56) References Cited

U.S. PATENT DOCUMENTS

| | | | |
|---|---|---|---|
| 3,795,827 A * | 3/1974 | Greger | 327/295 |
| 5,804,998 A * | 9/1998 | Cahill et al. | 327/108 |
| 5,808,480 A * | 9/1998 | Morris | 326/81 |
| 6,184,700 B1 * | 2/2001 | Morris | 326/14 |
| 6,518,818 B1 * | 2/2003 | Hynes | 327/333 |
| 7,239,178 B1 * | 7/2007 | Cornell et al. | 326/81 |
| 7,355,445 B2 * | 4/2008 | Kimura | 326/81 |
| 7,463,072 B2 * | 12/2008 | Kim et al. | 327/112 |

OTHER PUBLICATIONS

U.S. Appl. No. 11/691,106, filed Mar. 26, 2007, Mei Luo et al.
U.S. Appl. No. 11/825,164, filed Jul. 3, 2007, Ali Atesoglu.

* cited by examiner

*Primary Examiner* — James H Cho
(74) *Attorney, Agent, or Firm* — Steven J. Cahill

(57) ABSTRACT

A level shifter circuit includes an input circuit, an inverter, a pull-up circuit, and a pull-down circuit. The input circuit generates a pull-up signal in response to an input signal using charge from a supply voltage. The inverter inverts the input signal to generate a pull-down signal. The inverter comprises complementary transistors that receive charge from the supply voltage. The pull-up circuit pulls a level shifted output signal of the level shifter circuit to the supply voltage in response to the pull-up signal. The pull-down circuit pulls the level shifted output signal to a low voltage in response to the pull-down signal.

21 Claims, 6 Drawing Sheets

TECHNIQUES FOR LEVEL SHIFTING SIGNALS

BACKGROUND OF THE INVENTION

The present invention relates to electronic circuits, and more particularly, to level shifters that level shift signals.

Integrated circuit (IC) designs increasingly require interfaces between circuit blocks that have different voltage requirements. Level shifting circuits can be used to change a voltage level of an electronic signal from a first value to a second value.

BRIEF SUMMARY OF THE INVENTION

According to some embodiments of the present invention, a level shifter circuit includes an input circuit, an inverter, a pull-up circuit, and a pull-down circuit. The input circuit generates a pull-up signal in response to an input signal using charge from a supply voltage. The inverter inverts the input signal to generate a pull-down signal. The inverter comprises complementary transistors that receive charge from the supply voltage. The pull-up circuit pulls a level shifted output signal of the level shifter circuit to the supply voltage in response to the pull-up signal. The pull-down circuit pulls the level shifted output signal to a low voltage in response to the pull-down signal.

According to other embodiments of the present invention, a level shifter circuit includes an input circuit, a source follower transistor, an inverter, a pull-up circuit, and a pull-down circuit. The input circuit generates a pull-up signal in response to an input signal using charge from a supply voltage. The source follower transistor generates a reduced supply voltage using charge from the supply voltage. The inverter inverts the input signal to generate a pull-down signal using the reduced supply voltage from the source follower transistor. The pull-up circuit pulls a level shifted output signal of the level shifter circuit to the supply voltage in response to the pull-up signal. The pull-down circuit pulls the level shifted output signal of the level shifter circuit to a low voltage in response to the pull-down signal. The present invention includes methods and systems for performing the embodiments described herein.

Various objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
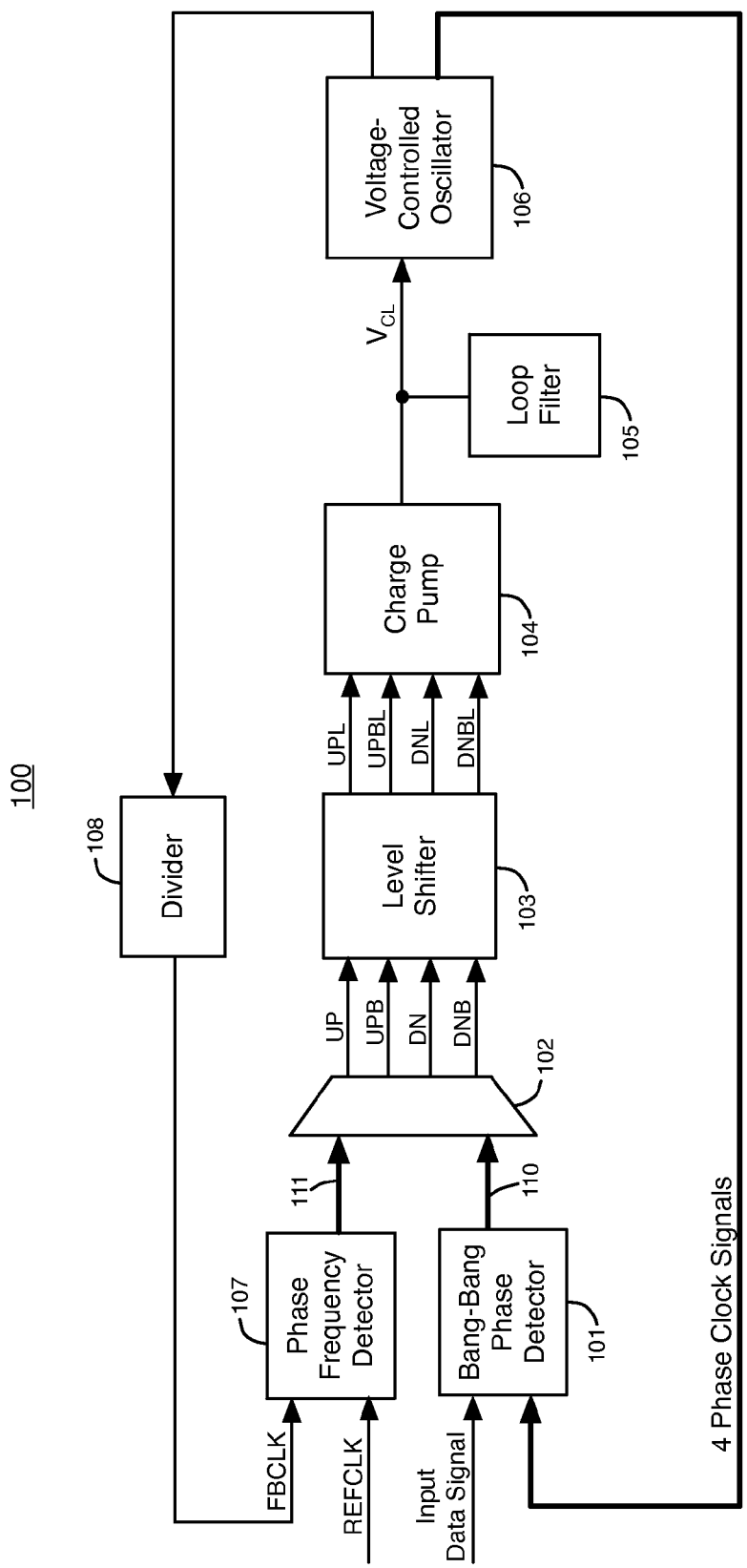
FIG. 1 is a diagram of a clock data recovery (CDR) and phase-locked loop (PLL) circuit, according to an embodiment of the present invention.

FIG. 1 is a diagram of a clock data recovery (CDR) and phase-locked loop (PLL) circuit 100, according to an embodiment of the present invention. Circuit 100 in FIG. 1 is merely one example of a circuit that can include embodiments of the present invention. It should be understood that embodiments of the present invention can be used in CDR and PLL circuits having numerous other configurations. Circuit 100 is typically fabricated on an integrated circuit, such as a field programmable gate array (FPGA) or an application specific integrated circuit (ASIC).

Circuit 100 includes a clock data recovery (CDR) feedback loop and a phase-locked loop (PLL). The CDR feedback loop includes a bang-bang phase detector circuit 101, multiplexers 102, a level shifter circuit 103, a charge pump circuit 104, a loop filter circuit 105, and a voltage-controlled oscillator (VCO) circuit 106. The PLL includes phase frequency detector (PFD) 107, multiplexers 102, level shifter circuit 103, charge pump circuit 104, loop filter 105, VCO 106, and frequency divider circuit 108. Multiplexers 102 can be configured to cause circuit 100 to operate as a CDR circuit or as a PLL.

Bang-bang phase detector (BBPD) 101 receives an input data signal. The input data signal contains a stream of digital data bits and is typically not a periodic signal. BBPD 101 is a binary phase detector circuit. BBPD 101 compares the phase of the input data signal to the phases of four periodic output clock signals generated by VCO 106. The four output clock signals generated by VCO 106 have four different phases (e.g., 0°, 90°, 180°, 270°). BBPD 101 generates four digital error signals on bus 110 that are indicative of the differences between the phase of the input data signal and the phases of the four clock signals generated by VCO 106. Bus 110 has 4 parallel signal lines.

The digital error signals are transmitted in parallel to input terminals of multiplexers 102 along bus 110. Multiplexers 102 include four 2-to-1 multiplexers. When circuit 100 is configured to operate as a clock data recovery (CDR) circuit, multiplexers 102 transmit the digital error signals from BBPD 101 on bus 110 to input terminals of level shifter 103 as four digital error signals UP, UPB, DN, and DNB. The UPB signal is the inverse of the UP signal, and the DNB signal is the inverse of the DN signal. Thus, UP and UPB are complementary signals, and DN and DNB are complementary signals.

The input data signal received at BBPD 101 typically contains some phase jitter. BBPD 101 adjusts the pulse widths of the UP and UPB signals or the pulse widths of the DN and DNB signals in response to changes in the phase differences between the input data signal and the four clock signals generated by VCO 106.

Level shifter 103 level shifts the UP, UPB, DN, and DNB error signals to generate four digital level shifted error signals UPL, UPBL, DNL, and DNBL, as described below with respect to FIG. 2. The level shifted error signals UPL, UPBL, DNL, and DNBL are transmitted to input terminals of charge pump 104. Charge pump 104 converts the level shifted UPL, UPBL, DNL, and DNBL error signals into an analog control voltage $V_{CL}$. The control voltage $V_{CL}$ is transmitted to voltage-controlled oscillator (VCO) 106. Loop filter 105 is a low pass filter that attenuates high frequency components of the control voltage $V_{CL}$. Loop filter 105 typically contains a capacitor.

VCO 106 generates multiple output clock signals. Four output clock signals of VCO 106 are transmitted to input terminals of phase detector 101. VCO 106 adjusts the phases of its output clock signals in response to changes in the control voltage $V_{CL}$. When circuit 100 functions as a CDR circuit, VCO 106 adjusts the phases of its four output clock signals in response to changes in the phase of the input data signal received at BBPD 101.

Before multiplexers 102 configure circuit 100 to operate as a CDR circuit, multiplexers 102 configure circuit 100 to operate as a PLL to match the frequency of the VCO output clock signals with the data rate of the input data signal received at BBPD 101. When circuit 100 is configured to operate as a PLL, the PLL adjusts the frequency of the output clock signals of VCO 106 until the frequency of the VCO output clock signals matches the data rate of the input data signal. The data rate of the input data signal is embodied in the frequency of an input reference clock signal REFCLK. REFCLK is transmitted to an input terminal of phase frequency detector 107.

During the PLL operation of circuit 100, frequency divider 108 divides the frequency of an output clock signal of VCO 106 to generate a frequency divided feedback clock signal FBCLK. Phase-frequency detector (PFD) 107 compares the phase and the frequency of the input reference clock signal REFCLK to the phase and the frequency of feedback clock signal FBCLK to generate four digital error signals that are transmitted in parallel on bus 111. The four digital error signals on bus 111 are indicative of the difference between the phases and the frequencies of the reference clock signal REFCLK and the feedback clock signal FBCLK. Multiplexers 102 transmit the digital error signals from PFD 107 on bus 111 to input terminals of level shifter 103 as four digital signals UP, UPB, DN, and DNB when circuit 100 is configured to function as a PLL.

VCO 106 selects the frequency of its output clock signals based on the frequency of the REFCLK clock signal. After the frequency of the output clock signals of VCO 106 equal the frequency of the REFCLK clock signal, multiplexers 102 disconnect PFD 107 from level shifter 103 and connect BBPD 101 to level shifter 103. VCO 106 then maintains its output clock signals at a constant frequency equal to the frequency of REFCLK. The frequency of the output clock signals of VCO 106 can be, for example, one-half the data rate of the input data signal (i.e., a half-rate CDR circuit).

Multiple supply voltages can be used to drive the transistors in circuit 100, for example, to increase the noise immunity, to provide a wider voltage range, to provide a faster design turn around time, to provide backward compatibility, to re-use a circuit block, or for many other reasons. When a signal is transmitted between circuit blocks that receive different supply voltages, a level shifter circuit can drive the signal from a lower voltage level to a higher voltage level or vice versa. For example, level shifter 103 in circuit 100 converts low voltage signals from BBPD 101 to higher voltage signals that can turn switches in charge pump 104 on and off.

Circuit 100 includes thin-oxide and thick-oxide metal oxide semiconductor field-effect transistors (MOSFETs). A thick-oxide transistor can tolerate a larger voltage applied to its gate terminal than a thin-oxide transistor. For example, a gate-to-source voltage of 1.8 volts that causes breakdown in a thin-oxide transistor does not cause breakdown in a thick-oxide transistor. However, a thin-oxide transistor typically operates at a higher speed than a thick-oxide transistor. The thin-oxide transistors in circuit 100 are high-speed transistors, because they turn on and off in less time than the thick-oxide transistors that receive a greater supply voltage. Using thick-oxide transistors in level shifter 103 can limit the switching speed of circuit 103 and hence limit the frequency of signals that circuit 103 is capable of generating or transmitting.

Level shifter 103 can operate at a high-speed, because level shifter 103 has thin-oxide transistors. For example, level shifter 103 can generate an output signal at 13 gigabytes per second (Gbps) with thin-oxide transistors that are fabricated using a 45-nanometer (nm) process. Thick-oxide transistors fabricated with a 45-nm process typically function at a slower speed, e.g., up to about 6-8 Gbps. Level shifter 103 achieves a high-speed by using thin-oxide transistors, without overstressing the gate oxide of the thin-oxide transistors.

Figure 2:
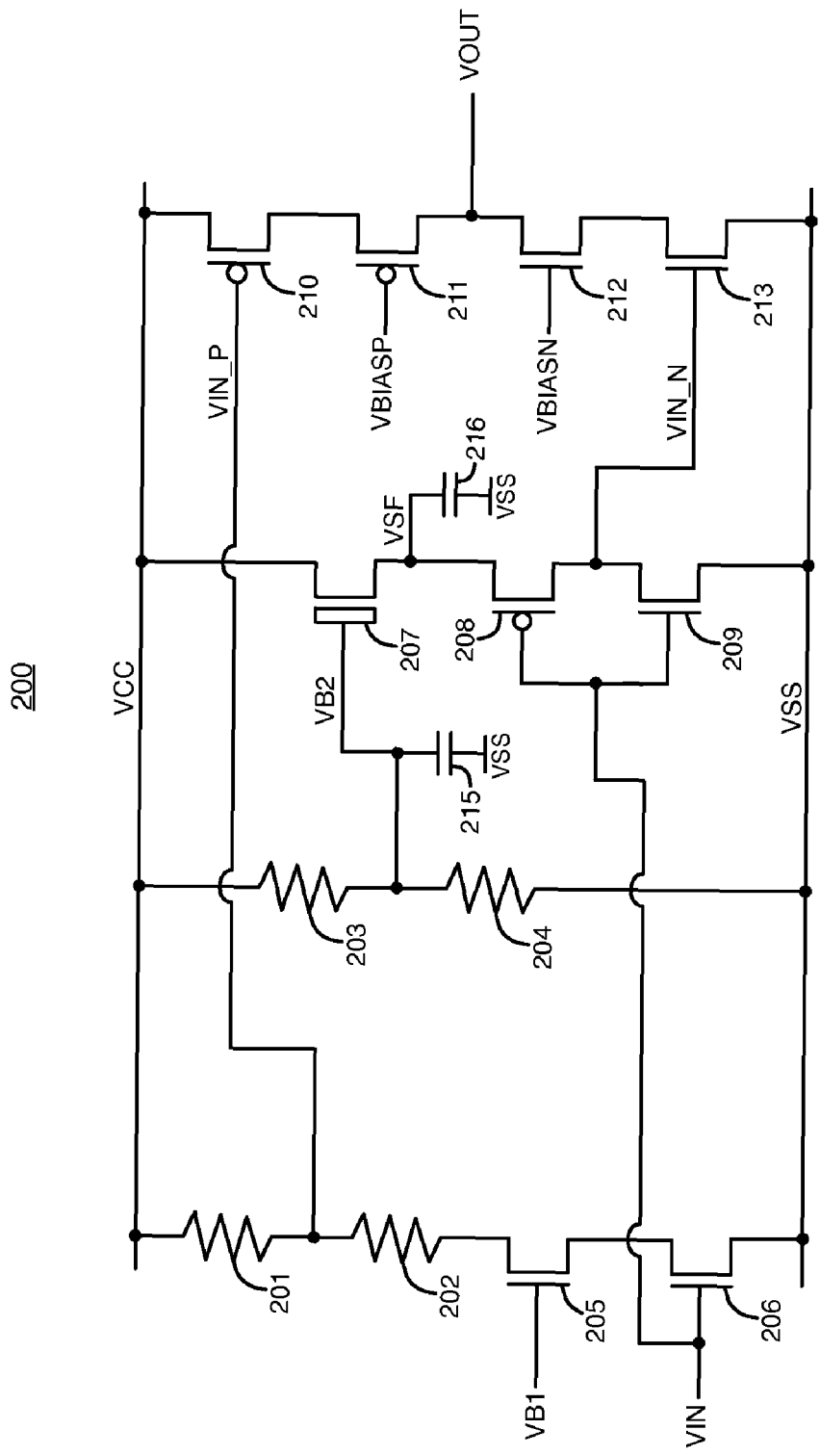
FIG. 2 is a diagram of a level shifter circuit, according to an embodiment of the present invention.

FIG. 2 is a diagram of a level shifter circuit 200, according to an embodiment of the present invention. Level shifter circuit 200 shifts the voltage of a time varying input voltage signal VIN to generate a time varying output voltage signal VOUT. The voltage of output signal VOUT varies over a larger voltage range than the voltage of input signal VIN.

Level shifter 200 includes resistors 201-204, transistors 205-213, and capacitors 215-216. Transistors 205, 206, 207, 209, and 212-213 are N-channel metal oxide semiconductor field-effect transistors (MOSFETs). Transistors 208, 210, and 211 are P-channel MOSFETs.

Transistors 205, 206, 208, 209, 210, 211, 212, and 213 are thin-oxide transistors. Thin-oxide N-channel transistors 205, 206, 209, 212, and 213 can, for example, be fabricated using a 45-nanometer (nm) process. In a 45-nm process, transistors 205, 206, 209, 212, and 213 can each have, e.g., a gate oxide thickness of about 24 angstroms that can withstand a gate-to-source voltage up to about 1.2 volts before breakdown occurs.

Thin-oxide P-channel transistors 208, 210, and 211 can, for example, be fabricated using a 45-nm process. In a 45-nm process, transistors 208, 210, and 211 can each have, e.g., a gate oxide thickness of about 26 angstroms that can withstand a source-to-gate voltage up to about 1.2 volts before breakdown occurs. The threshold voltages of thin-oxide transistors 205-206 and 208-213 are, for example, about 0.4 volts. As another example, each of transistors 205-206 and 208-213 can have a gate oxide thickness in the range of 20-35 angstroms.

Transistor 207 is a thick-oxide transistor. Thick-oxide N-channel transistor 207 can, for example, be fabricated using a 45-nm process. In a 45-nm process, transistor 207 can, for example, have a gate oxide thickness of about 56 angstroms that can withstand a gate-to-source voltage up to about 3.3 volts before breakdown occurs. The threshold voltage of thick-oxide transistor 207 is, for example, about 0.5 volts. These example parameters for transistors 205-213 are provided for the purpose of illustration and are not intended to limit the scope of the present invention. For example, the transistors in FIG. 2 can be fabricated using a 65-nanometer (nm) process or using a 32-nm process.

A supply voltage VCC (e.g., 1.8 volts) is applied to level shifter circuit 200. Supply voltage VCC and the other voltages described herein are referenced with respect to a ground voltage VSS. Resistors 201 and 203, the drain of transistor 207, and the source of transistor 210 receive supply voltage VCC. Resistor 204 and the sources of transistors 206, 209 and 213 receive ground voltage VSS (e.g., 0 volts). Resistors 201-202 and transistors 205-206 are coupled in series between the supply lines for VCC and VSS. Resistors 203-204 are coupled in series between the supply lines for VCC and VSS. Transistors 207-209 are coupled in series between the supply lines for VCC and VSS. Transistors 210-213 are coupled in series between the supply lines for VCC and VSS.

Level shifter circuit 200 can be a portion of level shifter 103 in FIG. 1. Input voltage signal VIN can be one of the digital error signals (UP, UPB, DN, or DNB) generated by BBPD 101 or PFD 107 and transmitted to level shifter 200 through multiplexers 102. Input voltage signal VIN is transmitted to the gates of transistors 206, 208, and 209. VIN is a time varying digital input voltage signal. A constant bias voltage VB1 is applied to the gate of N-channel transistor 205.

Resistors 201-202 and transistors 205-206 shift input voltage VIN to generate a time varying pull-up voltage signal VIN_P between resistors 201 and 202. Voltage VIN_P is transmitted to the gate of P-channel transistor 210. Transistors 205 and 206 are coupled together in a cascode configuration to form a cascode stage. In this cascode stage, transistor 205 is referred to as the cascode transistor.

When input voltage VIN turns transistor 206 off, voltage VIN_P is pulled up to supply voltage VCC. When VIN turns transistor 206 on, current flows through resistors 201-202 and transistors 205-206, pulling voltage VIN_P below VCC. Because the on resistance of transistors 205-206 is small compared to the resistances of resistors 201-202, resistors 201-202 function as a voltage divider between VCC and VSS. As a result, the resistor ratio ($R_{202}/(R_{201}+R_{202})$) determines the low voltage of VIN_P when transistor 206 is on. $R_{201}$ is the resistance of resistor 201, and $R_{202}$ is the resistance of resistor 202.

Resistors 203 and 204 are a resistor divider that generates a constant bias voltage VB2 on capacitor 215 at the gate of thick-oxide transistor 207. Transistor 207 functions as a source follower transistor. Transistor 207 generates a reduced supply voltage VSF on capacitor 216 at the source of transistor 207 in response to bias voltage VB2. The voltage VSF on capacitor 216 supplies current through transistor 208 when transistor 208 is on. Source follower transistor 207 and capacitors 215-216 maintain reduced supply voltage VSF at a substantially constant voltage.

P-channel MOSFET 208 and N-channel MOSFET 209 are complementary MOS (CMOS) transistors that form an inverter circuit. Transistors 208-209 invert input voltage VIN to generate a time varying pull-down voltage signal VIN_N using reduced supply voltage VSF. Voltage VIN_N is transmitted to the gate of N-channel transistor 213.

Voltage VIN_P rises and falls in response to VIN to cause transistor 210 to be switched on and off. Voltage VIN_N rises and falls in response to VIN to cause transistor 213 to be switched on and off. Transistors 210 and 213 are switched out of phase with each other, so that one transistor is off while the other transistor is on.

A constant bias voltage VBIASP is transmitted to the gate of P-channel transistor 211. Voltage VBIASP causes transistor 211 to be on when transistor 210 is on. Transistors 210 and 211 are coupled together in a cascode configuration to form a cascode stage. In this cascode stage, P-channel transistor 211 is referred to as the cascode transistor.

Another constant bias voltage VBIASN is transmitted to the gate of N-channel transistor 212. Voltage VBIASN causes transistor 212 to be on when transistor 213 is on. Transistors 212 and 213 are coupled together in a cascode configuration to form a cascode stage. In this cascode stage, N-channel transistor 212 is referred to as the cascode transistor.

Level shifter 200 generates a digital, time varying, level shifted, output voltage signal VOUT at the drains of transistors 211-212 in response to input voltage VIN. VOUT can be one of the level shifted output signals UPL, UPBL, DNL, or DNBL of level shifter 103 shown in FIG. 1. When VIN_P turns transistor 210 on, transistors 210-211 pull VOUT to supply voltage VCC. When VIN_N turns transistor 213 on, transistors 212-213 pull VOUT to ground voltage VSS.

Transistors 206, 208-209, 210, and 213 turn on and off in response to input voltage signal VIN varying between a logic high state and a logic low state. These transistors 206, 208-209, 210, and 213 are thin-oxide transistors. As mentioned above, thin-oxide transistors switch on and off faster than thick-oxide transistors. Thick-oxide transistor 207 does not switch on and off in response to logic state changes in VIN. Instead, transistor 207 maintains a substantially constant drain-to-source current in response to bias voltage VB2.

Because only thin-oxide transistors switch on and off in circuit 200 to convert input voltage VIN to output voltage VOUT, level shifter 200 can generate an output voltage VOUT that has a high frequency and a large data rate. For example, level shifter 200 can generate an output voltage signal VOUT having a maximum data rate of 13 Gbps in response to an input voltage signal VIN having a data rate of 13 Gbps.

Figure 3:
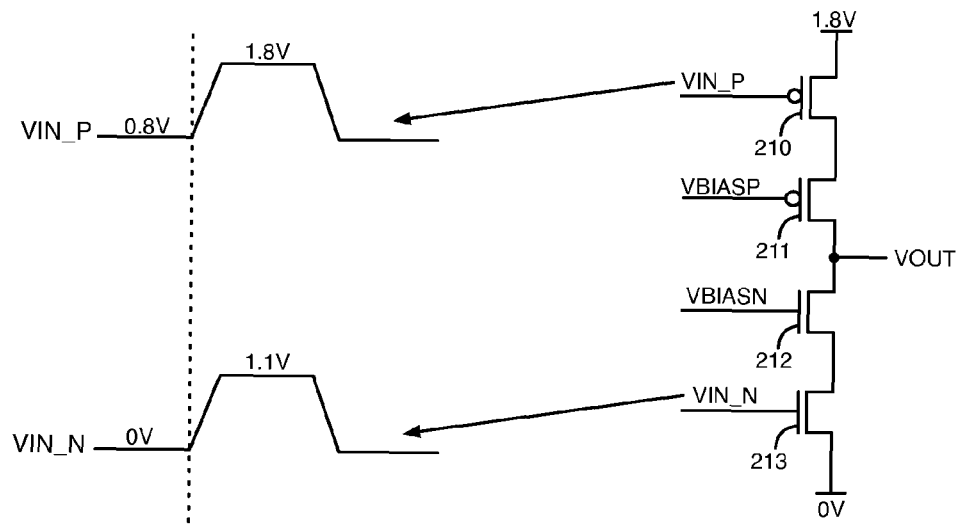
FIG. 3 is a diagram that illustrates example waveforms for two internal nodes in the level shifter of FIG. 2, according to an embodiment of the present invention.

Input voltage VIN can, for example, vary between 1.1 volts (a logic high state) and 0 volts (a logic low state). Each of the resistors 201-202 can be, for example, within the range of 1-5 kiloohms (kΩ). The supply voltage VCC applied to level shifter 200 can be, for example, 1.8 volts. Bias voltage VB1 applied to the gate of transistor 205 can be, for example, about 0.9 volts. Using these example values, voltage VIN_P varies between 1.8 volts and about 0.8 volts, as shown in FIG. 3, and the gate-to-source voltage of transistor 205 remains below the example breakdown voltage of 1.2 volts. If voltage VOUT varies between 1.8 volts and 0 volts, the source-to-gate voltage of transistor 210 also remains below the example breakdown voltage of 1.2 volts.

The bias voltage VB2 at the gate of transistor 207 depends on the ratios of resistors 203 and 204. The voltage VSF at the source of transistor 207 depends on the resistance $R_{203}$ of resistor 203, the resistance $R_{204}$ of resistor 204, and the threshold voltage $V_{TH,207}$ of thick-oxide transistor 207, as shown below in equation (1).

$$VSF = \left(VCC \times \frac{R_{204}}{(R_{203}+R_{204})}\right) - V_{TH,207} \quad (1)$$

If VCC is 1.8 volts, and $V_{TH,207}$ is 500 mV, the resistances of resistors 203-204 can be selected to generate a bias voltage of 1.6 volts for VB2, and a voltage of 1.1 volts for VSF on capacitor 216.

Resistors 203 and 204 are typically selected to have resistance values greater than 10 kΩ to reduce power consumption in circuit 200. Also, large resistance values for resistors 203-204 generate a large RC time constant with capacitor 215. The large RC time constant helps to reduce noise-induced fluctuations in bias voltage VB2, so that the current through transistor 207 and voltage VSF remain substantially constant. Capacitor 216 also reduces noise-induced fluctuations in voltage VSF at the sources of transistors 207-208.

The voltage VSF on capacitor 216 functions as a supply voltage for transistors 208-209. Source follower transistor 207 generates a reduced supply voltage VSF (e.g., 1.1 volts) for supplying charge to transistors 208-209 using charge from supply voltage VCC (e.g., at 1.8 volts) without using a second supply voltage that is independent of supply voltage VCC. A second supply voltage that is independent of supply voltage VCC may add additional noise to the output voltage VOUT of level shifter 200, which is undesirable.

Source follower transistor 207, capacitors 215-216, and resistors 203-204 create a substantially constant supply voltage VSF (e.g., 1.1 volts) for supplying charge to transistors 208-209. If VSF remains at about 1.1 volts, and VIN varies between 1.1 and 0 volts, the source-to-gate voltage of P-channel transistor 208 remains below the example breakdown voltage of 1.2 volts. The gate-to-source voltage of N-channel transistor 209 also remains below the example breakdown voltage of 1.2 volts.

Pull-down voltage VIN_N at the drains of transistors 208-209 and at the gate of transistor 213 varies between, e.g., 0 volts and 1.1 volts in response to VIN, as shown in FIG. 3. Pull-up voltage VIN_P varies between, e.g., 1.8 volts and about 0.8 volts, as shown in FIG. 3. The bias voltage VBIASP at the gate of transistor 211 can be, for example, at a voltage of about 70% of the supply voltage VCC or within 50%-90% of VCC. The bias voltage VBIASN at the gate of transistor 212 can be, for example, at a voltage of about 30% of the supply voltage VCC or within 10%-50% of VCC. Bias voltages VBIASP and VBIASN can be generated, for example, using a resistor divider. Bias voltages VBIASP and VBIASN can be programmable bias voltages.

When transistor 210 is on, and transistor 213 is off, transistors 210-211 pull the output voltage VOUT of circuit 200 up to the supply voltage VCC (e.g., 1.8 volts). When transistor 213 is on, and transistor 210 is off, transistors 212-213 pull the output voltage VOUT down to the ground voltage VSS. The source-to-gate voltages of P-channel transistors 210-211 remain below the example breakdown voltage of 1.2 volts, and the gate-to-source voltages of N-channel transistors 212-213 remain below the example breakdown voltage of 1.2 volts.

Level shifter 200 converts an input voltage VIN that varies between a first voltage range (e.g., 0 to 1.1 volts) into an output voltage VOUT that varies between a second voltage range (e.g., 0 to 1.8 volts) using only one supply voltage VCC (e.g., 1.8 volts). Level shifter 200 level shifts VIN to generate VOUT without using charge from two separate and independent supply voltages. Reduced supply voltage VSF is dependent on VCC. Level shifter 200 receives noise from only one supply voltage VCC, rather than receiving noise from two separate and independent supply voltages. As a result, output voltage signal VOUT at the output terminal of level shifter 200 contains less supply voltage induced jitter.

The voltages and resistance values described above with respect to FIG. 2 are example values that are provided for the purpose of illustration and are not intended to limit the scope of the present invention to these specific example values.

Figure 4:
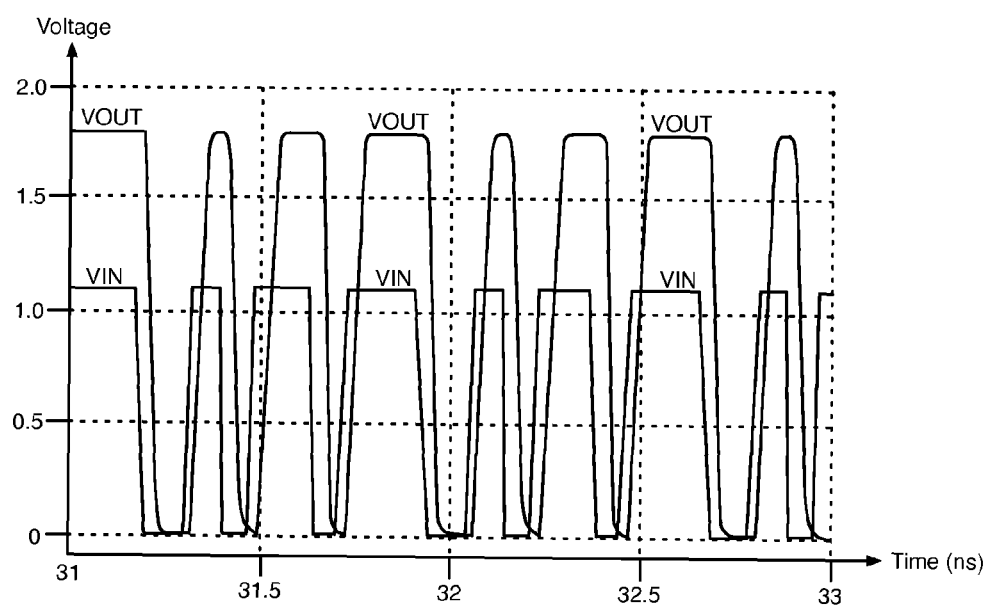
FIG. 4 is a graph that illustrates example waveforms for input voltage VIN and output voltage VOUT signals generated by the level shifter of FIG. 2, according to an embodiment of the present invention.

FIG. 4 is a graph that illustrates example waveforms for input voltage VIN and output voltage VOUT generated by level shifter 200 of FIG. 2, according to an embodiment of the present invention. VIN varies between 1.1 and 0 volts, and VOUT varies between 1.8 volts and 0 volts. In the example of FIG. 4, level shifter 200 generates a 13 Gbps output voltage signal VOUT having a frequency of 13 GHz in response to a 13 Gbps input voltage signal VIN having a frequency of 13 GHz.

Figure 5:
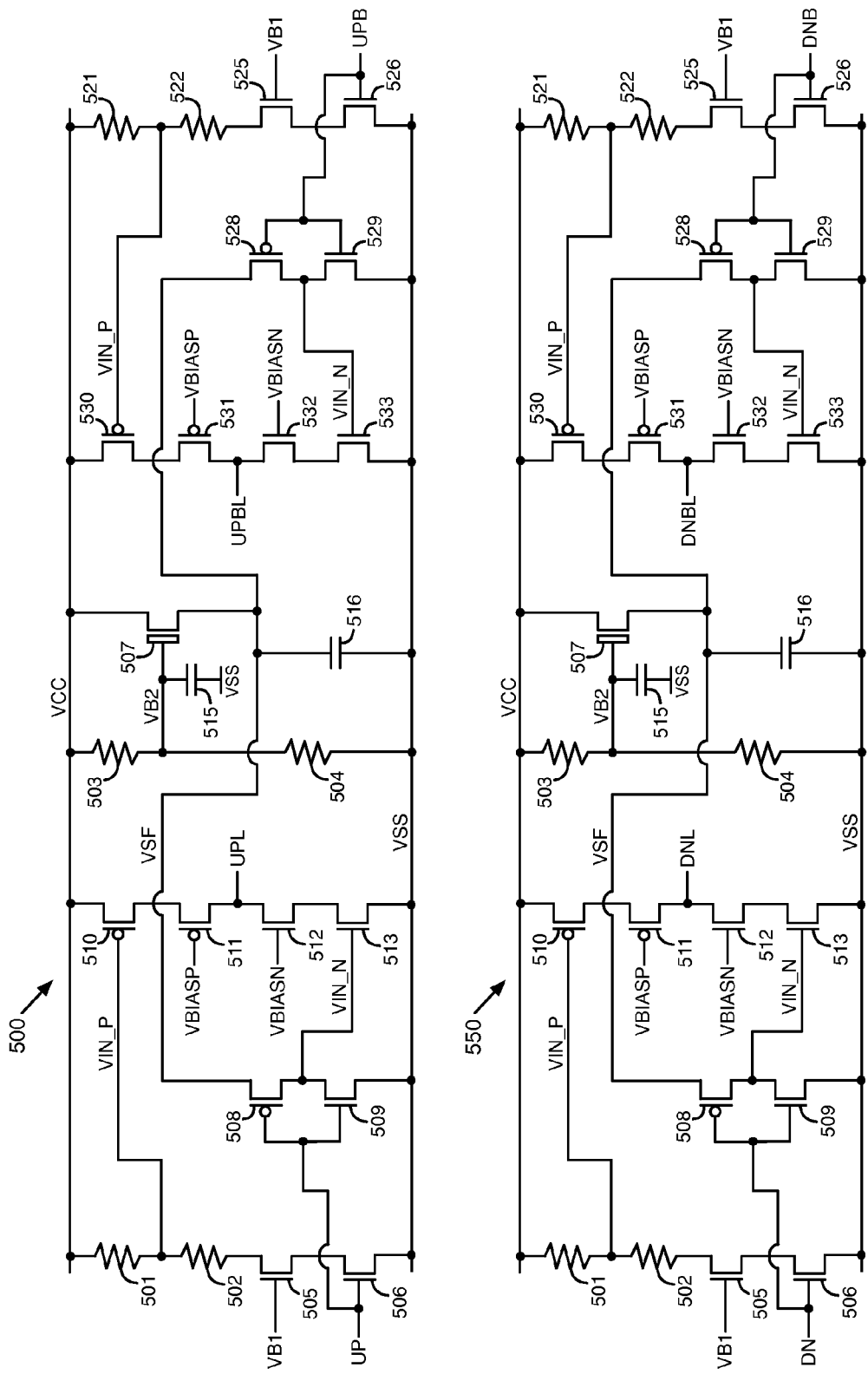
FIG. 5 is a diagram of two level shifter circuits, according to an embodiment of the present invention.

FIG. 5 is a diagram of two level shifter circuits 500 and 550, according to an embodiment of the present invention. Level shifter circuits 500 and 550 can together implement level shifter 103 in FIG. 1. Level shifters 500 and 550 level shift four input voltage signals UP, UPB, DN, and DNB to generate four level shifted output voltage signals UPL, UPBL, DNL, and DNBL. Input voltage signals UP, UPB, DN, and DNB are transmitted from either BBPD 101 or PFD 107 through multiplexers 102 to level shifters 500 and 550.

Level shifters 500 and 550 both include resistors 501-504 and 521-522; n-channel MOSFETs 505-507, 509, 512-513, 525-526, 529, and 532-533; p-channel MOSFETs 508, 510-511, 528, and 530-531; and capacitors 515-516. Level shifters 500 and 550 include identical circuit elements. Level shifters 500 and 550 receive a supply voltage VCC (e.g., 1.8 volts) and a ground voltage VSS (e.g., 0 volts).

Resistors 501-504, transistors 505-513, and capacitors 515-516 function the same as resistors 201-204, transistors 205-213, and capacitors 215-216, respectively, as described above with respect to FIG. 2. In addition, resistors 521-522 and 503-504, transistors 525-526, 507, and 528-533, and capacitors 515-516 function the same as resistors 201-204, transistors 205-213, and capacitors 215-216, respectively, as described above with respect to FIG. 2.

Level shifter 500 level shifts input signal UP to generate level shifted output signal UPL. Level shifter 500 also level shifts input signal UPB to generate level shifted output signal UPBL. Level shifter 550 level shifts input signal DN to generate level shifted output signal DNL. Level shifter 550 level shifts input signal DNB to generate level shifted output signal DNBL.

In level shifter 500, input signal UP is transmitted to the gates of transistors 506, 508, and 509. Resistors 501-504, transistors 505-513, and capacitors 515-516 level shift the voltage of input signal UP to generate level shifted output signal UPL at the drains of cascode transistors 511-512.

In level shifter 500, input signal UPB is transmitted to the gates of transistors 526, 528, and 529. Resistors 521-522 and 503-504, capacitors 515-516, and transistors 525-526, 507, and 528-533 level shift the voltage of input signal UPB to generate level shifted output signal UPBL at the drains of cascode transistors 531-532.

In level shifter 550, input signal DN is transmitted to the gates of transistors 506, 508, and 509. Resistors 501-504, transistors 505-513, and capacitors 515-516 level shift the voltage of input signal DN to generate level shifted output signal DNL at the drains of cascode transistors 511-512.

In level shifter 550, input signal DNB is transmitted to the gates of transistors 526, 528, and 529. Resistors 521-522 and 503-504, capacitors 515-516, and transistors 525-526, 507, and 528-533 level shift the voltage of input signal DNB to generate level shifted output signal DNBL at the drains of cascode transistors 531-532.

In level shifters 500 and 550, transistors 508 and 528 receive current from transistor 507 at different times. Because input signals UP/UPB are complementary signals, and input signals DN/DNB are complementary signals, source follower transistor 507 provides current to only one of transistors 508 or 528 at a time. For example, when UP is in a logic low state, and UPB is in a logic high state, transistor 507 provides current through transistor 508 to the gate of transistor 513. When UP is in a logic high state, and UPB is in a logic low state, transistor 507 provides current through transistor 528 to the gate of transistor 533. Transistor 507 can be double the size of transistor 207 to provide faster switching and better performance.

Figure 6:
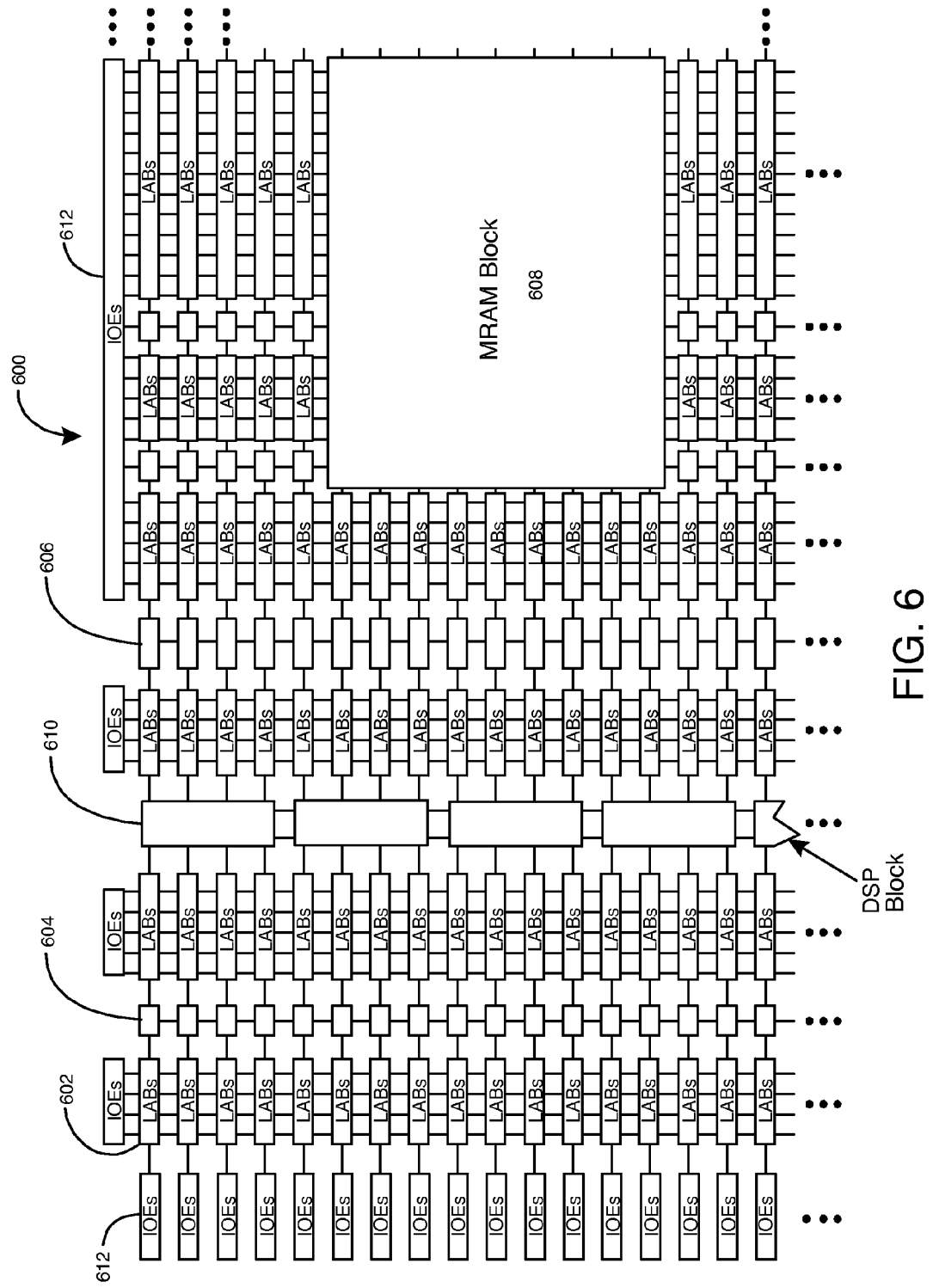
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also has a distributed memory structure including random access memory (RAM) blocks of varying sizes provided throughout the array. The RAM blocks include, for example, blocks 604, blocks 606, and block 608. These memory blocks can also include shift registers and FIFO buffers.

FPGA 600 further includes digital signal processing (DSP) blocks 610 that can implement, for example, multipliers with add or subtract features. Input/output elements (IOEs) 612 located, in this example, around the periphery of the chip, support numerous single-ended and differential input/output standards. IOEs 612 are coupled to input/output pins. Each of the input/output pins is an external terminal of the FPGA. It is to be understood that FPGA 600 is described herein for illustrative purposes only and that the present invention can be implemented in many different types of PLDs, FPGAs, and ASICs.

Figure 7:
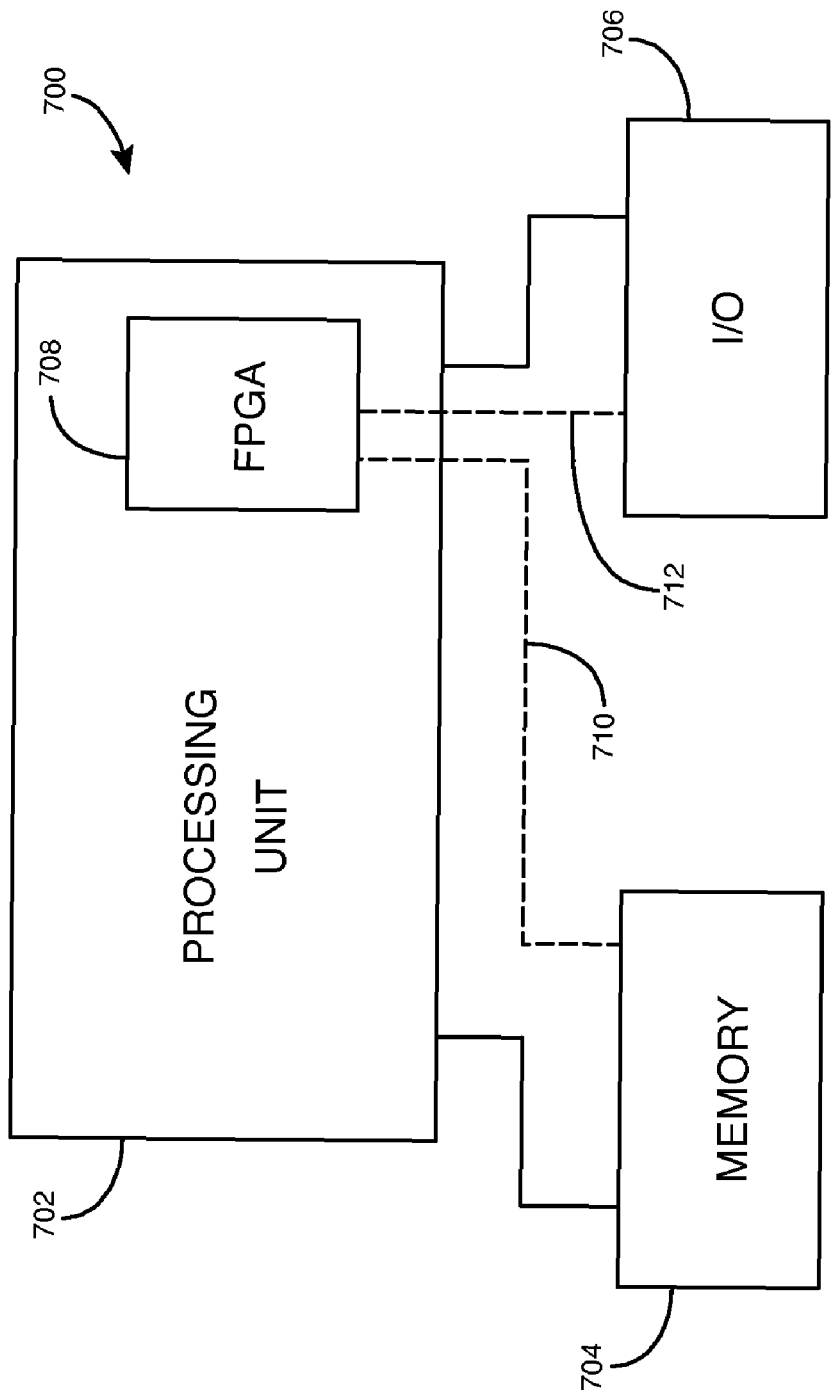
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor, which can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A level shifter circuit comprising:
an input circuit operable to generate a pull-up signal in response to an input signal using charge from a supply voltage;
an inverter operable to invert the input signal to generate a pull-down signal, wherein the inverter comprises first and second complementary transistors operable to receive charge from the supply voltage;
a pull-up circuit operable to pull a level shifted output signal at an output terminal of the level shifter circuit to the supply voltage in response to the pull-up signal; and
a pull-down circuit operable to pull the level shifted output signal to a low voltage in response to the pull-down signal, wherein the pull-down circuit comprises a third transistor operable to receive the pull-down signal at a control input and a fourth cascode transistor coupled between the third transistor and the output terminal of the level shifter circuit, and wherein the fourth cascode transistor is operable to receive a first bias voltage at a control input that equals 50% or less of the supply voltage.

2. The level shifter circuit defined in claim 1 further comprising:
a source follower transistor operable to generate a reduced supply voltage from the supply voltage for supplying charge to the inverter.

3. The level shifter circuit defined in claim 1, wherein the input circuit comprises:
a fifth transistor operable to receive the input signal at a control input;
a sixth cascode transistor coupled to the fifth transistor and operable to receive a second bias voltage at a control input;
a first resistor coupled to the sixth cascode transistor; and
a second resistor coupled to the first resistor, wherein the pull-up signal is generated between the first and the second resistors.

4. The level shifter circuit defined in claim 1, wherein the pull-up circuit comprises a fifth transistor operable to receive the pull-up signal at a control input, and a sixth cascode transistor coupled to the fifth transistor, the sixth cascode transistor operable to receive a second bias voltage at a control input.

5. The level shifter circuit defined in claim 1, wherein the level shifter circuit is fabricated on a programmable logic integrated circuit.

6. A level shifter circuit comprising:
an input circuit operable to generate a pull-up signal in response to an input signal using charge from a supply voltage;
an inverter operable to invert the input signal to generate a pull-down signal, wherein the inverter comprises first and second complementary transistors;
a pull-up circuit operable to pull a level shifted output signal of the level shifter circuit to the supply voltage in response to the pull-up signal;
a pull-down circuit operable to pull the level shifted output signal to a low voltage in response to the pull-down signal, wherein the pull-down circuit comprises a third transistor operable to receive the pull-down signal at a control input and a fourth cascode transistor coupled to the third transistor, and wherein the fourth cascode transistor is operable to receive a bias voltage at a control input; and
a source follower transistor operable to generate a reduced supply voltage from the supply voltage for supplying charge to the inverter,
wherein the source follower transistor is a thick-oxide transistor, the input circuit comprises thin-oxide transistors, the first and the second complementary transistors are thin-oxide transistors, the pull-up circuit comprises thin-oxide transistors, and the pull-down circuit comprises thin-oxide transistors.

7. A level shifter circuit comprising:
a first input circuit operable to generate a first pull-up signal in response to a first input signal using charge from a supply voltage;
a first inverter operable to invert the first input signal to generate a first pull-down signal, wherein the first inverter comprises first and second complementary transistors operable to receive charge from the supply voltage;
a first pull-up circuit operable to pull a first level shifted output signal of the level shifter circuit to the supply voltage in response to the first pull-up signal;
a first pull-down circuit operable to pull the first level shifted output signal to a low voltage in response to the first pull-down signal, wherein the first pull-down circuit comprises a third transistor operable to receive the first pull-down signal at a control input and a fourth cascode transistor coupled to the third transistor, and wherein the fourth cascode transistor is operable to receive a first bias voltage at a control input;
a second input circuit operable to generate a second pull-up signal in response to a second input signal using charge from the supply voltage;
a second inverter operable to invert the second input signal to generate a second pull-down signal, wherein the second inverter comprises fifth and sixth complementary transistors operable to receive charge from the supply voltage;
a second pull-up circuit operable to pull a second level shifted output signal of the level shifter circuit to the supply voltage in response to the second pull-up signal; and
a second pull-down circuit operable to pull the second level shifted output signal of the level shifter circuit to the low voltage in response to the second pull-down signal.

8. A level shifter circuit comprising:
an input circuit operable to generate a pull-up signal in response to an input signal using charge from a supply voltage;
a transistor operable to generate a reduced supply voltage using charge from the supply voltage;
a resistor divider operable to generate a bias voltage at a gate terminal of the transistor;
an inverter operable to invert the input signal to generate a pull-down signal using the reduced supply voltage from the transistor;
a pull-up circuit operable to pull a level shifted output signal of the level shifter circuit to the supply voltage in response to the pull-up signal; and
a pull-down circuit operable to pull the level shifted output signal of the level shifter circuit to a low voltage in response to the pull-down signal.

9. The level shifter circuit defined in claim 8, wherein the inverter comprises complementary P-channel and N-channel transistors.

10. A level shifter circuit comprising:
an input circuit operable to generate a pull-up signal in response to an input signal using charge from a supply voltage, wherein the input circuit comprises a first resistor and a second resistor coupled to the first resistor, wherein the pull-up signal is generated between the first and the second resistors;
an inverter operable to invert the input signal to generate a pull-down signal using charge from the supply voltage;
a pull-up circuit operable to pull a level shifted output signal of the level shifter circuit to the supply voltage in response to the pull-up signal; and
a pull-down circuit operable to pull the level shifted output signal of the level shifter circuit to a low voltage in response to the pull-down signal.

11. The level shifter circuit defined in claim 10, wherein the input circuit further comprises:
a first transistor operable to receive the input signal at a control input; and
a second cascode transistor coupled to the first transistor and operable to receive a bias voltage at a control input.

12. A level shifter circuit comprising:
an input circuit operable to generate a pull-up signal in response to an input signal using charge from a supply voltage, wherein the input circuit comprises a first transistor operable to receive the input signal at a control input, and a second cascode transistor coupled to the first transistor, and wherein the first transistor is coupled between a source of the second cascode transistor and a node at a ground voltage;
a third transistor operable to generate a reduced supply voltage using charge from the supply voltage;
a capacitor coupled to a control input of the third transistor;
an inverter operable to invert the input signal to generate a pull-down signal using the reduced supply voltage;
a pull-up circuit operable to pull a level shifted output signal at an output terminal of the level shifter circuit to the supply voltage in response to the pull-up signal; and
a pull-down circuit operable to pull the level shifted output signal to a low voltage in response to the pull-down signal.

13. The level shifter circuit defined in claim 12 further comprising:
a resistor divider coupled to the control input of the third transistor.

14. A level shifter circuit comprising:
a first input circuit operable to generate a first pull-up signal in response to a first input signal using charge from a supply voltage;
a source follower transistor operable to generate a reduced supply voltage using charge from the supply voltage;
a first inverter operable to invert the first input signal to generate a first pull-down signal using the reduced supply voltage from the source follower transistor;
a first pull-up circuit operable to pull a first level shifted output signal of the level shifter circuit to the supply voltage in response to the first pull-up signal;
a first pull-down circuit operable to pull the first level shifted output signal of the level shifter circuit to a low voltage in response to the first pull-down signal;
a second input circuit operable to generate a second pull-up signal in response to a second input signal using charge from the supply voltage;
a second inverter operable to invert the second input signal to generate a second pull-down signal using the reduced supply voltage from the source follower transistor;
a second pull-up circuit operable to pull a second level shifted output signal of the level shifter circuit to the supply voltage in response to the second pull-up signal; and
a second pull-down circuit operable to pull the second level shifted output signal of the level shifter circuit to the low voltage in response to the second pull-down signal.

15. The level shifter circuit defined in claim 14, wherein the level shifter circuit is operable to transmit the first and the second level shifted output signals to a charge pump circuit in a clock data recovery circuit.

16. A method for level shifting an input signal to generate a level shifted output signal, the method comprising:
generating a pull-up signal in response to the input signal using a first transistor, a second cascode transistor, and charge from a supply voltage, wherein the input signal is provided to a control input of the first transistor, wherein a bias voltage is provided to a control input of the second cascode transistor, and wherein the first transistor is coupled between a source of the second cascode transistor and a node at a ground voltage;
generating a reduced supply voltage using a third transistor operable to provide charge from the supply voltage, wherein a control input of the third transistor is coupled to a capacitor;
inverting the input signal to generate a pull-down signal using the reduced supply voltage;
pulling the level shifted output signal to the supply voltage in response to the pull-up signal; and
pulling the level shifted output signal to a low voltage in response to the pull-down signal.

17. The method defined in claim 16, wherein a resistor divider is coupled to the control input of the third transistor.

18. The method defined in claim 16, wherein the third transistor is a source follower transistor.

19. The method defined in claim 16, wherein inverting the input signal to generate the pull-down signal using the reduced supply voltage further comprises varying the pull-down signal between the reduced supply voltage and the low voltage, and wherein the reduced supply voltage is maintained at a substantially constant voltage.

20. A method for level shifting input signals to generate level shifted output signals, the method comprising:
generating a first pull-up signal in response to a first input signal using a first transistor, a second cascode transistor coupled to the first transistor, and charge from a supply voltage;
generating a reduced supply voltage using charge from the supply voltage;
inverting the first input signal to generate a first pull-down signal using the reduced supply voltage;
pulling a first level shifted output signal to the supply voltage in response to the first pull-up signal;
pulling the first level shifted output signal to a low voltage in response to the first pull-down signal;
generating a second pull-up signal in response to a second input signal using charge from the supply voltage;
inverting the second input signal to generate a second pull-down signal using the reduced supply voltage;
pulling a second level shifted output signal to the supply voltage in response to the second pull-up signal; and
pulling the second level shifted output signal to the low voltage in response to the second pull-down signal.

21. A method for level shifting an input signal to generate a level shifted output signal, the method comprising:
generating a pull-up signal in response to the input signal using a first transistor, a second cascode transistor coupled to the first transistor, and charge from a supply voltage;
generating a reduced supply voltage using charge from the supply voltage;
inverting the input signal to generate a pull-down signal using the reduced supply voltage;
pulling the level shifted output signal to the supply voltage in response to the pull-up signal; and
pulling the level shifted output signal to a low voltage in response to the pull-down signal, wherein generating the pull-up signal in response to the input signal using a first transistor, a second cascode transistor coupled to the first transistor, and charge from a supply voltage further comprises generating the pull-up signal between first and second resistors coupled to the second cascode transistor.

* * * * *